United States Patent
Tsukamoto

(10) Patent No.: US 7,439,659 B2
(45) Date of Patent: Oct. 21, 2008

(54) PIEZOELECTRIC ACTUATOR, DROPLET EJECTION APPARATUS, AND MANUFACTURING METHOD THEREOF

(75) Inventor: Ryuji Tsukamoto, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/355,154

(22) Filed: Feb. 16, 2006

(65) Prior Publication Data
US 2006/0186766 A1  Aug. 24, 2006

(30) Foreign Application Priority Data
Feb. 18, 2005  (JP) .............................. 2005-042630

(51) Int. Cl.
*H01L 25/00* (2006.01)
(52) U.S. Cl. .................. 310/359; 310/311; 310/324; 310/365; 347/68; 347/69; 347/70; 347/71
(58) Field of Classification Search .................. 310/324, 310/363, 364, 365, 366; 347/68, 69, 70, 347/71, 72
See application file for complete search history.

(56) References Cited

U.S. PATENT DOCUMENTS

| | | | |
|---|---|---|---|
| 6,674,222 B2 * | 1/2004 | Masters et al. ............... | 310/359 |
| 6,695,439 B2 | 2/2004 | Takahashi | |
| 6,739,704 B2 | 5/2004 | Takahashi | |
| 6,863,383 B2 | 3/2005 | Takahashi | |
| 2003/0098633 A1 * | 5/2003 | Nishimura et al. .......... | 310/366 |

FOREIGN PATENT DOCUMENTS

| | | | |
|---|---|---|---|
| JP | 10-119262 A | | 5/1998 |
| JP | 2002-292869 A | | 10/2002 |
| JP | 2002292869 A | * | 10/2002 |
| JP | 2002-355981 A | | 12/2002 |
| JP | 2002-368297 A | | 12/2002 |
| JP | 2002355981 A | * | 12/2002 |
| JP | 2003-8091 A | | 1/2003 |
| JP | 2003008091 A | * | 1/2003 |
| JP | 2003-224312 A | | 8/2003 |

* cited by examiner

*Primary Examiner*—Darren Schuberg
*Assistant Examiner*—Bryan P Gordon
(74) *Attorney, Agent, or Firm*—Birch, Stewart, Kolasch & Birch, LLP

(57) ABSTRACT

The piezoelectric actuator comprises: a plate-shaped piezoelectric body which has a portion polarized in a thickness direction of the piezoelectric body and a portion polarized in a direction oblique to the thickness direction; and a pair of electrodes which are disposed on opposite surfaces of the piezoelectric body facing each other in the thickness direction across the piezoelectric body, have plane-symmetrical portions and plane-asymmetrical portions in relation to the piezoelectric body, are used as polarization electrodes for polarizing the piezoelectric body so that the portion polarized in the thickness direction and the portion polarized in the direction oblique to the thickness direction are formed in the piezoelectric body, and are used as drive electrodes for inducing strain in the piezoelectric body.

9 Claims, 9 Drawing Sheets

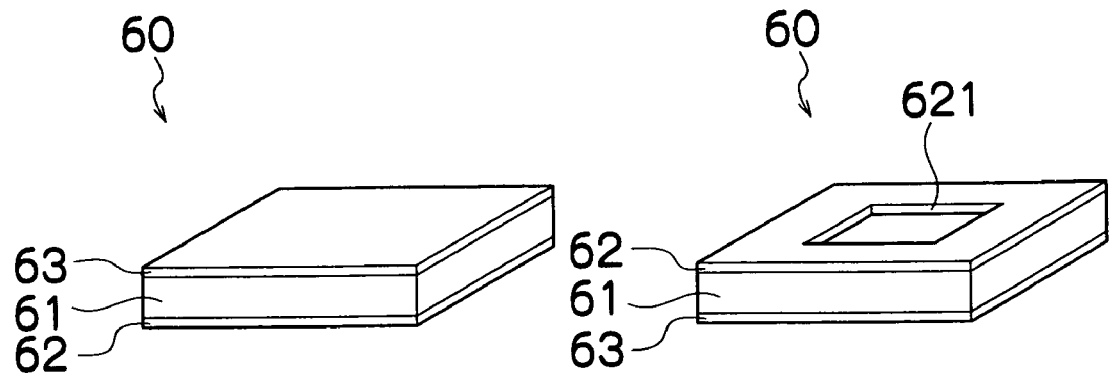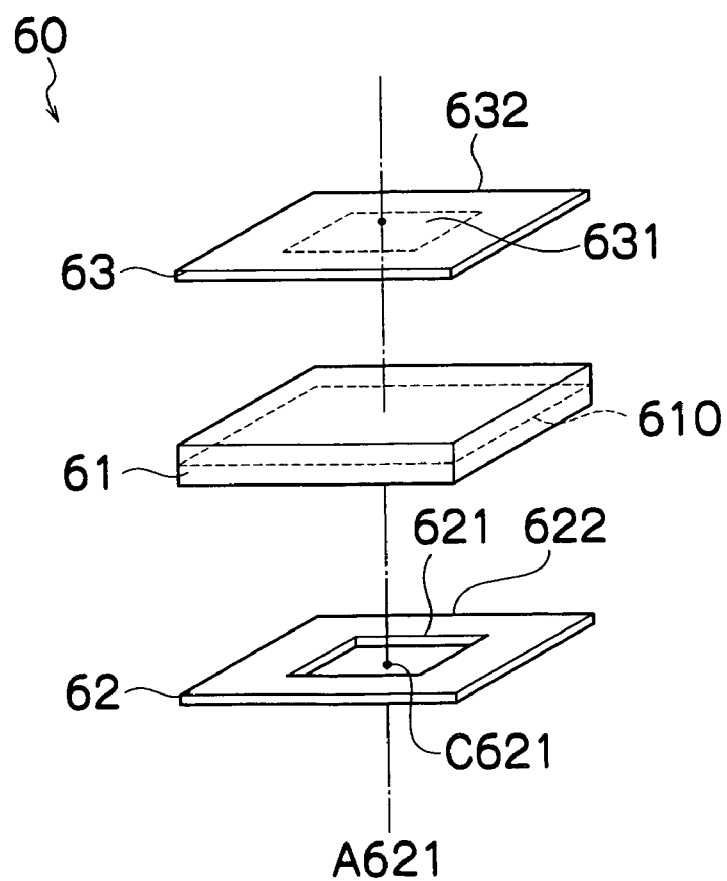

PIEZOELECTRIC ACTUATOR, DROPLET EJECTION APPARATUS, AND MANUFACTURING METHOD THEREOF

BACKGROUND OF THE INVENTION

1. Field of the Invention

The present invention relates to a piezoelectric actuator, a droplet ejection apparatus, and a manufacturing method thereof, and more particularly to a piezoelectric actuator that is subjected to polarizing treatment and is displaced as a result of the application of a drive electric field, to a droplet ejection apparatus that ejects droplets by using the displacement of the piezoelectric actuator, and to a manufacturing method thereof.

2. Description of the Related Art

There are known inkjet heads having multiple nozzles (holes) and forming images on paper or another such recording medium by ejecting ink droplets from the nozzles onto the recording medium while moving relatively to the recording medium.

Examples of such inkjet heads include inkjet heads designed so that ink is supplied to pressure chambers partially configured from a diaphragm, the diaphragm is deformed by driving of piezoelectric actuators by the application of electrical signals corresponding to image data onto the piezoelectric actuators, the capacity of the pressure chambers are thereby reduced, and the ink inside the pressure chambers are then ejected as droplets from the nozzles.

Examples of the piezoelectric actuators used in such inkjet heads generally include so-called 31-mode actuators, which use the displacement (strain) induced in the direction perpendicular to the poling direction when the drive electric field is applied in the poling direction; so-called 33-mode actuators, which use the displacement induced in the poling direction when the drive electric field is applied in the poling direction; and so-called 15-mode actuators, to which the drive electric field is applied in the direction perpendicular to the poling direction.

An example of a piezoelectric actuator in the related art is shown in FIG. 13. In FIG. 13, the piezoelectric actuator 960 is a 31-mode actuator, and has a plate-shaped piezoelectric body 961, and a pair of entire surface electrodes 962 and 963, which are disposed on both sides of the piezoelectric body 961 to face to each other across the piezoelectric body 961 in the thickness direction. The entire piezoelectric body 961 is uniformly polarized in the thickness direction by the entire surface electrodes 962 and 963, as indicated by the arrows in FIG. 13. The piezoelectric actuator 960 thereby polarized is attached to a diaphragm 56. Specific voltages corresponding to image data relating to image formation are then applied to the pair of entire surface electrodes 962 and 963, and stress is applied to the diaphragm 56 in the thickness direction using the displacement induced in the piezoelectric body 961 in the direction perpendicular to the thickness direction, as shown in FIG. 14. FIG. 15 shows a schematic view of the shape of the diaphragm 56 when displacement is at a maximum.

Japanese Patent Application Publication No. 10-119262 (see FIG. 1 in particular) discloses a 33-mode driven piezoelectric actuator. This actuator has a sheet-shaped piezoelectric body, and a total of two pairs of drive electrodes; the drive electrodes of one of the pairs are disposed on both sides of the piezoelectric body at positions corresponding to the middle of the pressure chamber or cavity (positions over the pressure chamber), and the drive electrodes of the other of the pairs are disposed on both sides of the piezoelectric body at positions corresponding to the side wall (positions diagonally above the pressure chamber). When the piezoelectric body is polarized, the pair of electrodes at the middle is used as the positive and the pair of electrodes at the side wall is used as the negative, and the piezoelectric body is polarized in the direction along its surface or the direction perpendicular to the thickness direction. The drive electric field is applied during driving in the same direction as the polarization.

Piezoelectric actuators with various structures such as those described below have been proposed with the purpose of achieving high displacement.

Japanese Patent Application Publication No. 2003-008091 (see FIG. 1 is particular) discloses an actuator having a sheet-shaped piezoelectric body, with pairs of drive electrodes (the lower electrodes are the common electrode) disposed on both sides of the piezoelectric body at positions corresponding to the middle of the pressure chamber or cavity, and at positions corresponding to the peripheral edge of the pressure chamber. The piezoelectric actuator is designed so that strains oriented in two ways opposite by 180 degrees are created in the middle portion and the peripheral edge portion of the piezoelectric body as a result of applying opposite voltages in the drive electrodes in the middle and the drive electrodes in the peripheral edge, respectively. The poling directions are set in advance also to be oriented in two ways opposite by 180 degrees in the middle portion and the peripheral edge portion of the piezoelectric body, respectively.

Japanese Patent Application Publication No. 2002-355981 (see FIGS. 1, 2, and 5 in particular) discloses a 15-mode driven piezoelectric actuator, in which the direction of the drive electric field is substantially perpendicular to the poling direction, and the piezoelectric actuator has a layered structure in which a plurality of thin plates of piezoelectric ceramic are stacked. A plurality of dedicated polarizing inner-layer electrodes are formed in the interior of this layered structure, these dedicated polarizing inner-layer electrodes are used to achieve polarization in the direction along the surface or the direction perpendicular to the thickness direction, and the dedicated polarizing inner-layer electrodes are then removed by polishing or the like. Thereafter, a plurality of dedicated driving electrodes are formed, and an electric field is applied in the thickness direction through these dedicated driving electrodes. In this piezoelectric actuator, the polarization is achieved at the directions somewhat oblique to the direction along the surface or the direction perpendicular to the thickness direction on a microscopic level as a result of the layered structure, and the drive electric field is applied in the direction somewhat oblique to the poling direction. However, the piezoelectric actuator remains the 15-mode actuator and is polarized in the direction along the surface or the direction substantially perpendicular to the thickness direction as described above, and a drive electric field is applied in the thickness direction so as to be substantially perpendicular to the poling direction.

Japanese Patent Application Publication No. 2002-368297 (see FIG. 1 in particular) also discloses a 15-mode driven piezoelectric actuator with a layered structure. A plurality of dedicated polarizing inner-layer electrodes are formed in the interior of this layered structure, the dedicated polarizing inner-layer electrodes are connected to lead electrodes on the surface of the piezoelectric body by means of a through-hole structure prior to the polarization treatment, the connection is severed after the polarization treatment, and the polarizing electrodes themselves remain in the layered structure while the dedicated driving electrodes are used during driving.

Japanese Patent Application Publication No. 2003-224312 (see FIG. 8 in particular) discloses a piezoelectric actuator with a layered structure, in which a plurality of inner-layer electrodes are formed in the interior of the layered structure, and the actuator has a middle portion (first region) wherein 33-mode driving is performed in which the polarization is achieved in the thickness direction and the drive electric field is applied in the poling direction (the thickness direction) to induce the displacement in the poling direction (the thickness direction), and a peripheral portion (second region) wherein 15-mode driving is performed in which the polarization is achieved in the thickness direction and the drive electric field is applied in the direction perpendicular to the poling direction (the thickness direction).

Japanese Patent Application Publication No. 2002-292869 (see FIG. 4 in particular) discloses a piezoelectric actuator with a layered structure, in which a plurality of inner-layer electrodes are formed in the interior of the layered structure, and the actuator has a top layer wherein 33-mode driving is performed in which the polarization is achieved in the direction perpendicular to the thickness direction and the drive electric field is applied in the poling direction (perpendicular to the thickness direction) to utilize the displacement in the poling direction (perpendicular to the thickness direction), and a bottom layer wherein 31-mode driving is performed in which the polarization is achieved in the thickness direction and the drive electric field is applied in the poling direction (the thickness direction) to utilize the displacement in the direction perpendicular to the poling direction (the thickness direction).

However, the above-described techniques in the related art have had problems in that either high displacement cannot be achieved, or manufacturing costs are increased in order to achieve high displacement.

The actuator disclosed in Japanese Patent Application Publication No. 10-119262 has the two pairs of drive electrodes disposed along the surface or in the direction perpendicular to the thickness direction, and the amount of displacement is always less at the same voltage than with the actuator having the drive electrodes that are disposed on both sides of the piezoelectric body, as in the piezoelectric actuator 960 shown in FIG. 13. The drive electric field must be increased to achieve a displacement equal to or greater than that of the piezoelectric actuator in FIG. 13, which results in an inevitable increase in power consumption.

In the actuator disclosed in Japanese Patent Application Publication No. 2003-008091, since the poling directions must be oriented in two ways opposite by 180 degrees in the middle portion and the peripheral edge portion of the piezoelectric body, then generally the polarization treatment must be conducted twice, requiring more labor during manufacture, which leads to an inevitable increase in manufacturing costs.

In the actuator disclosed in Japanese Patent Application Publication No. 2002-355981, the dedicated polarizing inner-layer electrodes separate from the drive electrodes must be formed inside the layered structure, and the dedicated polarizing inner-layer electrodes must be removed by polishing or the like after the polarization treatment, requiring more labor during manufacture, which leads to an inevitable increase in manufacturing costs.

In the actuator disclosed in Japanese Patent Application Publication No. 2002-368297, the dedicated polarizing inner-layer electrodes separate from the drive electrodes must be formed inside the layered structure, and the connection between the dedicated polarizing inner-layer electrodes and the lead electrodes on the surface of the piezoelectric body must be severed after the polarization treatment, requiring more labor during manufacture, which leads to an inevitable increase in manufacturing costs.

In the actuators disclosed in Japanese Patent Application Publication Nos. 2003-224312 and 2002-292869, since the drive electric fields are applied in the plurality of modes, then there is a greater number of electrodes, the positional relationship between the electrodes becomes complicated, and errors in the positions thereof affect displacement. Therefore, individual differences between piezoelectric actuators are easily caused by nonuniformities in the electrode arrangements, and efforts to maintain consistency between the piezoelectric actuators reduce the yield rate, leading to an inevitable increase in manufacturing costs.

Moreover, the actuators disclosed in Japanese Patent Application Publication Nos. 2002-355981, 2002-368297, 2003-224312, and 2002-292869 must have the layered structure, and therefore inevitably have higher manufacturing costs than a piezoelectric actuator that can be configured as a single plate, such as is shown in FIG. 13. Another problem with the actuators in the related art is that it is difficult for them to be thinned.

Next, the matter of errors in aligning positions during mounting of the actuator 960 in the related art shown in FIG. 13 is described.

FIGS. 16A and 16B are schematic diagrams showing the relationship between the positional relationship of the piezoelectric actuator 960 to the pressure chamber 52 and the amount of stress-induced displacement in the thickness direction. In FIGS. 16A and 16B, the piezoelectric actuator 960 is not shown for the sake of simplicity, and the positional relationship is depicted by the vertical line A52 passing through the middle of the pressure chamber 52 and the vertical line A960 passing through the middle of the piezoelectric actuator 960. FIG. 16A shows the state of displacement of the diaphragm 56 in the thickness direction at the most preferred positional alignment, in which the vertical lines A52 and A960 coincide. FIG. 16B shows the state of displacement of the diaphragm 56 in the thickness direction at a positional alignment in which the vertical lines A52 and A960 are misaligned.

As shown in FIGS. 16A and 16B, when the vertical lines A52 and A960 are misaligned, the amount of displacement of the diaphragm 56 in the thickness direction decreases according to the amount of misalignment Agap. More specifically, the difference in the amounts of displacement of the diaphragm 56 in the thickness direction (h90-h91) increases as the amount of misalignment Agap increases. In other words, the piezoelectric actuators 960 in the related art have had problems in that there are likely to be performance differences between the actually produced individual piezoelectric actuators 960 as a result of errors in positional alignment, and the yield rate decreases as a result of such performance differences, which leads to an increase in manufacturing costs.

SUMMARY OF THE INVENTION

In view of such circumstances, an object of the present invention is to provide a piezoelectric actuator, a droplet ejection apparatus and a manufacturing method thereof, in which high displacement can be achieved and manufacturing costs can be suppressed.

In order to attain the aforementioned object, the present invention is directed to a piezoelectric actuator, comprising: a plate-shaped piezoelectric body which has a portion polarized in a thickness direction of the piezoelectric body and a portion polarized in a direction oblique to the thickness direction; and a pair of electrodes which are disposed on opposite surfaces of the piezoelectric body facing each other in the thickness direction across the piezoelectric body, have plane-symmetrical portions and plane-asymmetrical portions in relation to the piezoelectric body, are used as polarization electrodes for polarizing the piezoelectric body so that the portion polarized in the thickness direction and the portion polarized in the direction oblique to the thickness direction are formed in the piezoelectric body, and are used as drive electrodes for inducing strain in the piezoelectric body.

According to this configuration, as a result of the pair of electrodes having plane-symmetrical portions and plane-asymmetrical portions in relation to the piezoelectric body, a portion polarized in the thickness direction and a portion polarized in directions oblique to the thickness direction are formed on the piezoelectric body when this pair of electrodes is used for polarization treatment, and an electric field is created in substantially the same directions as polarization in the interior of the piezoelectric body to induce strain in the piezoelectric body when the pair of electrodes is used for driving, and high displacement is therefore achieved. Also, since the pair of electrodes is used for both polarization treatment and driving, there is no need for additional steps for providing dedicated polarizing electrodes and then removing these electrodes after polarization treatment. There is also no need to align a plurality of electrodes for a plurality of different modes in the direction along the surface or the direction perpendicular to the thickness direction.

Preferably, the piezoelectric body is made of a single plate.

According to this configuration, manufacturing costs can be reduced to be less than with a conventional piezoelectric actuator that has a layered structure in order to achieve high displacement.

Preferably, the piezoelectric body has the portion polarized in the thickness direction at a peripheral portion of the piezoelectric body in a direction along the surface, and has the portion polarized in the direction oblique to the thickness direction at a middle portion of the piezoelectric body in the direction along the surface.

According to this configuration, since the strain in the periphery of the piezoelectric body is primarily in the direction along the surface (the direction perpendicular to the thickness direction) and the strain in the middle is primarily in the oblique directions as a result of the application of drive electric fields, the actual amount of stress-induced deformation in the middle portion is greater.

Preferably, an opening is formed in one of the pair of electrodes.

For example, a shape of the opening is one of a polygon, a circle, and a slit.

In order to attain the aforementioned object, the present invention is also directed to a droplet ejection apparatus, comprising: the above-described piezoelectric actuator; a pressure chamber of which capacity is varied by the piezoelectric actuator; and a nozzle which is connected to the pressure chamber and ejects a droplet due to a change in capacity of the pressure chamber.

In order to attain the aforementioned object, the present invention is also directed to a droplet ejection apparatus, comprising: the above-described piezoelectric actuator including the electrode having the opening; a pressure chamber of which capacity is varied by the piezoelectric actuator; and a nozzle which is connected to the pressure chamber and ejects a droplet due to a change in capacity of the pressure chamber, wherein the piezoelectric actuator is arranged so that a vertical line passing through a middle of the pressure chamber passes through the opening in the electrode.

In order to attain the aforementioned object, the present invention is also directed to a method of manufacturing a piezoelectric actuator, comprising the steps of: forming a plate-shaped piezoelectric body; forming, on opposite surfaces of the piezoelectric body facing each other in a thickness direction of the piezoelectric body across the piezoelectric body, a pair of electrodes which have plane-symmetrical portions and plane-asymmetrical portions in relation to the piezoelectric body and are used as drive electrodes for inducing strain in the piezoelectric body; and forming, in the piezoelectric body, a portion polarized in the thickness direction and a portion polarized in a direction oblique to the thickness direction, by using the pair of electrodes as polarization electrodes for polarizing the piezoelectric body.

In order to attain the aforementioned object, the present invention is also directed to a method of manufacturing a droplet ejection apparatus, comprising the step of mounting the piezoelectric actuator manufactured by the above-described method, through a diaphragm, onto a plate provided with a pressure chamber communicated with a nozzle.

According to the present invention, high displacement can be achieved, and manufacturing costs can be suppressed.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIGS. 3A and 3B are perspective views showing piezoelectric actuators according to embodiments of the present invention;

FIG. 4 is an exploded perspective view of the piezoelectric actuator;

DETAILED DESCRIPTION OF THE PREFERRED EMBODIMENTS

Figure 1:
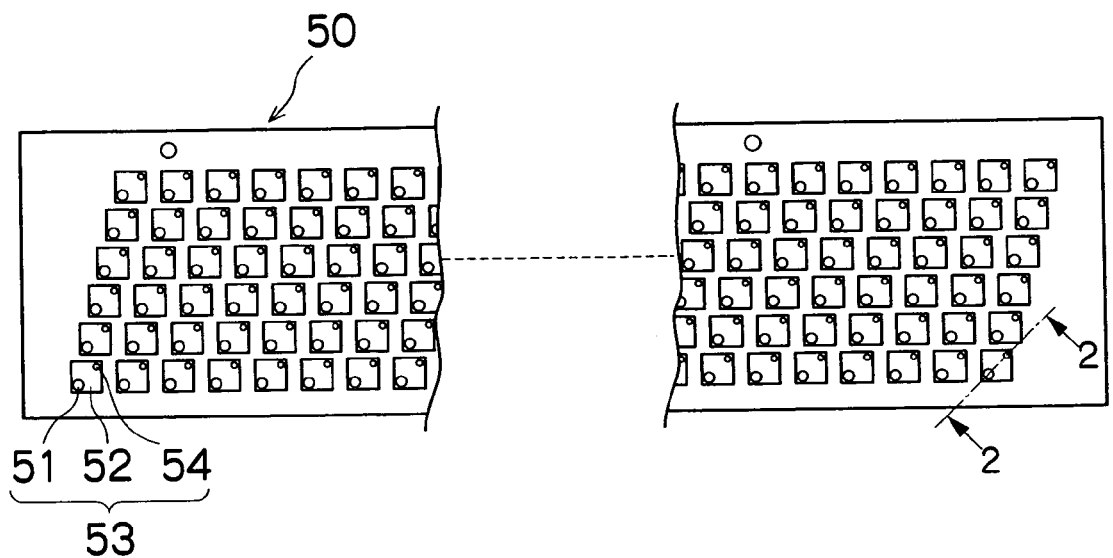
FIG. 1 is a perspective plan view showing an inkjet head as a droplet ejection apparatus according to an embodiment of the present invention.

FIG. 1 is a perspective plan view showing an inkjet head 50 as a droplet ejection apparatus according to an embodiment of the present invention.

In FIG. 1, the inkjet head 50 has a plurality of nozzles 51 arrayed spanning a length exceeding at least one side of a recording paper of maximum size. More specifically, the inkjet head 50 is configured from a two-dimensional matrix array of a plurality of pressure chamber units 53 that are configured including the nozzles 51, from which droplets of ink are ejected, pressure chambers 52 for applying pressure to the ink when the ink droplets are ejected through the nozzles 51, and ink supply ports 54 for supplying the ink to the pressure chambers 52 from a common flow channel (not shown). In the embodiment shown in FIG. 1, when the pressure chambers 52 are seen from above, each pressure chamber unit 53 has the nozzle 51 formed at one end of a diagonal, and the ink supply port 54 arranged at the other end.

Figure 2:
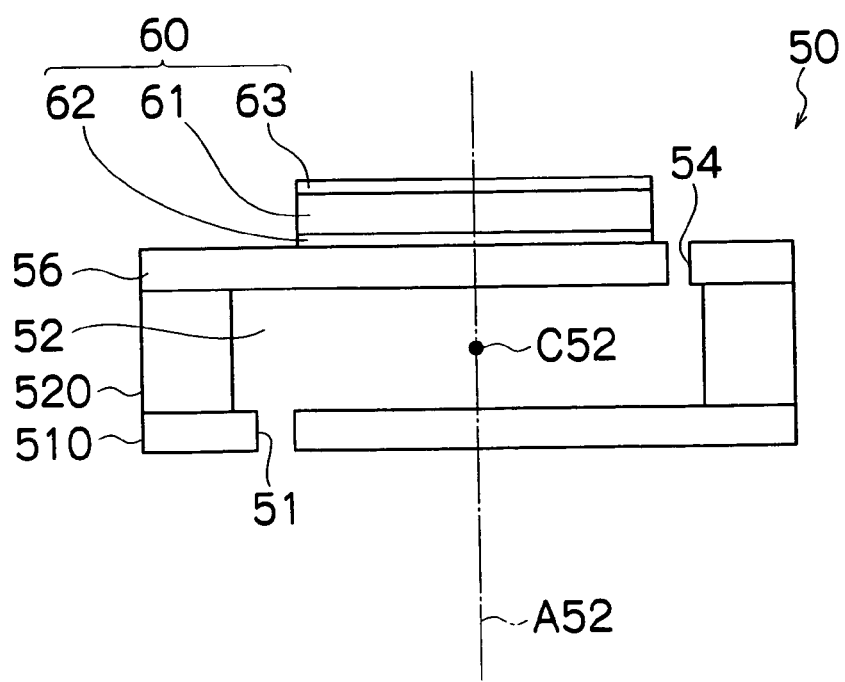
FIG. 2 is a cross-sectional view showing the principal portion of the inkjet head.

FIG. 2 shows a cross-sectional view along the line 2-2 in FIG. 1.

As shown in FIG. 2, the inkjet head 50 has a diaphragm 56 disposed on one side of the pressure chamber 52, which varies in capacity and applies pressure to the ink when the ink droplet is ejected. A piezoelectric actuator 60 is disposed on the side of the diaphragm 56 different from the side facing the pressure chamber 52, and serves as a pressure-generating device for generating pressure and varying the capacity in the pressure chamber 52. The diaphragm 56 transmits the pressure generated by the piezoelectric actuator 60 to the pressure chamber 52.

The diaphragm 56 is common to the plurality of pressure chambers 52 and is formed from a single plate. The piezoelectric actuators 60 for the pressure chambers 52 are disposed in the portions of the diaphragm 56 that correspond to the pressure chambers 52, respectively. The piezoelectric actuator 60 is formed of a piezoelectric body 61 and electrodes 62 and 63 disposed on both sides of the piezoelectric body 61 for applying an electric field to the piezoelectric body 61 in the thickness direction.

Although only one nozzle 51, pressure chamber 52, ink supply port 54 and piezoelectric actuator 60 are shown in FIG. 2, pluralities of each of these are formed on the inkjet head 50 in actuality.

This type of inkjet head 50 has a structure in which the following members are stacked from the bottom up: a nozzle plate 510 in which the nozzles 51 are formed, a pressure chamber plate 520 in which the pressure chambers 52 are formed, the diaphragm 56, and the piezoelectric actuators 60.

FIG. 3A is a perspective view showing an embodiment of the piezoelectric actuator 60, and FIG. 3B is a perspective view showing an upside down view of the piezoelectric actuator 60 in FIG. 3A. FIG. 4 is an exploded perspective view of the piezoelectric actuator 60 in FIG. 3A.

The piezoelectric body 61 of the piezoelectric actuator 60 is configured as a single plate. The electrodes 62 and 63 made of metal are formed on the piezoelectric body 61 at both surfaces perpendicular to the thickness direction of the piezoelectric body 61.

The pair of electrodes 62 and 63 have different planar shapes, wherein the electrode 62 has a pattern with an opening 621 in the middle in the direction along the surface (the direction perpendicular to the thickness direction) and partially covers the surface of the piezoelectric body 61, and the other electrode 63 covers the entire surface of the piezoelectric body 61 with no opening.

The electrode 62 having the opening and covering the partial surface is hereinafter referred to as a "partial surface electrode", and the electrode 63 covering the entire surface is hereinafter referred to as an "entire surface electrode."

The surface of the entire surface electrode 63 can be seen in FIG. 3A, and the surface of the partial surface electrode 62 can be seen in FIG. 3B. In FIG. 4, the reverse side of the partial surface electrode 62 and the surface of the entire surface electrode 63 can be seen.

In the electrodes 62 and 63, the peripheral edge 632 of the entire surface electrode 63 and the peripheral edge 622 of the partial surface electrode 62 are symmetrical, while the middle portion 631 of the entire surface electrode 63 and the middle portion 621 (the opening) of the partial surface electrode 62 are asymmetrical, with respect to a dividing plane 610 in the middle that serves as a plane of symmetry and divides the piezoelectric body 61 into two equal parts in the thickness direction, as shown in FIG. 4. In other words, the electrodes 62 and 63 have portions that are plane-symmetrical and portions that are plane-asymmetrical with respect to the piezoelectric body 61. The middle portion 631 and the peripheral edge 632 of the entire surface electrode 63 are described separately for the sake of clear description; however, the structure is integrated.

The piezoelectric actuator 60 is disposed so that the vertical line A52 passing through the middle C52 of the pressure chamber 52 shown in FIG. 2 (the vertical line of the piezoelectric body 61, the electrodes 62 and 63, and the diaphragm 56) also passes through the opening 621 of the partial surface electrode 62. When the piezoelectric actuator 60 is mounted on the diaphragm 56, it is substantially positioned so that the vertical line A52 passing through the center C52 of the pressure chamber 52 also passes through the center C621 of the opening 621 (i.e., so that the vertical line A52 in FIG. 2 and the vertical line A621 in FIG. 4 coincide); however, positioning errors to a certain extent are acceptable. The extent to which such positioning errors are acceptable is described later.

The electrodes 62 and 63 are not only used for driving to induce strain in the piezoelectric body 61 as a result of the inverse piezoelectric effect, but are also used for polarization treatment to polarize the piezoelectric body 61.

Figure 5:
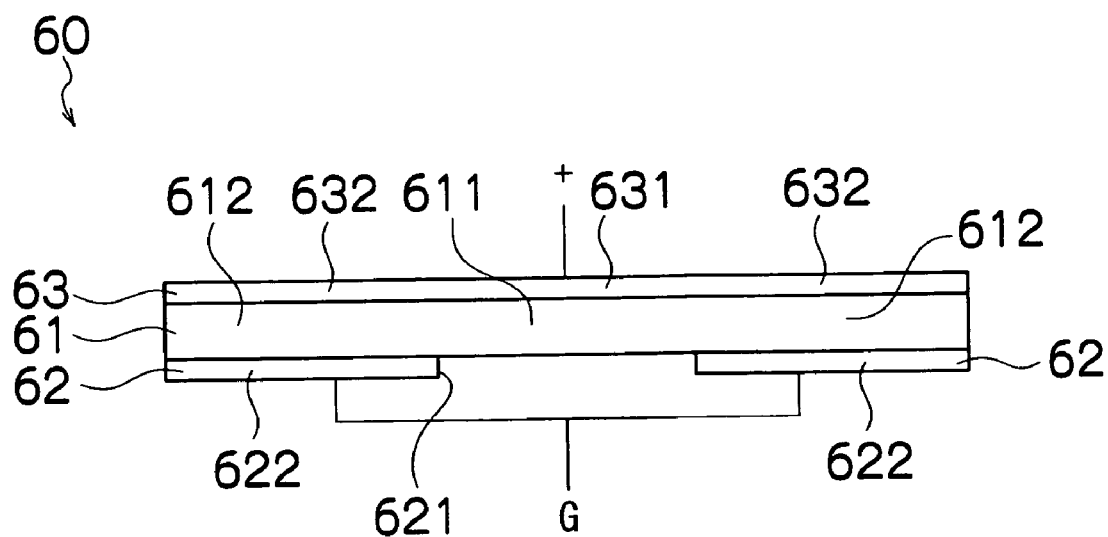
FIG. 5 is an explanatory diagram used to describe the application of voltage to the electrodes during polarization treatment.
Figure 6:
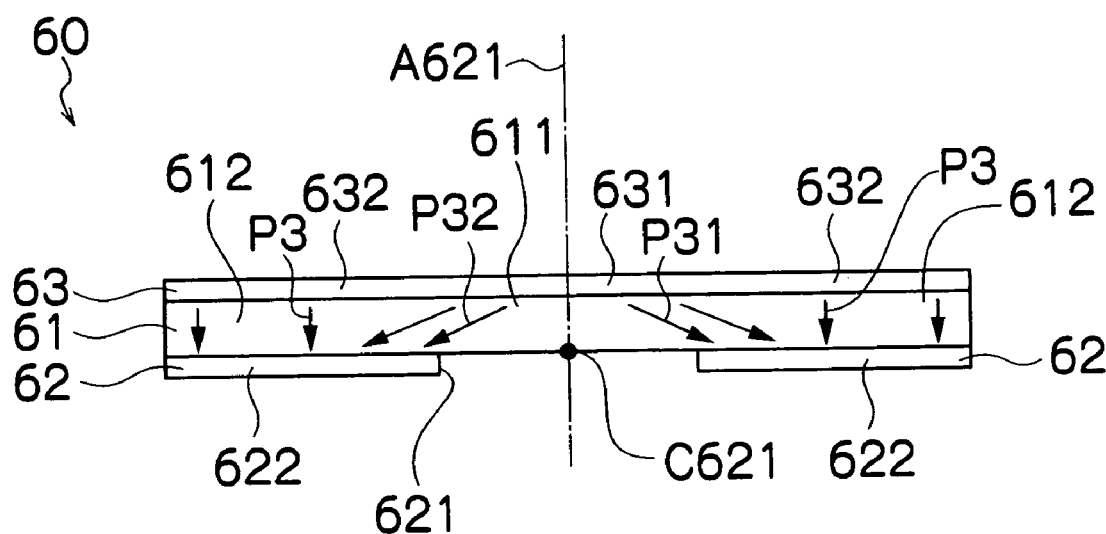
FIG. 6 is an explanatory diagram used to describe the poling direction.

During the polarization treatment, for example, as shown in FIG. 5, a specific voltage is applied between the electrodes 62 and 63, with the partial surface electrode 62 as a ground electrode (negative electrode) and the entire surface electrode 63 as a positive electrode. Thereby, as shown in FIG. 6, the middle portion 611 of the piezoelectric body 61 in the direction along the surface is polarized primarily in directions oblique to the thickness direction as shown by the arrows P31 and P32 in FIG. 6, and the peripheral edge 612 of the piezoelectric body 61 in the direction along the surface is polarized primarily in the thickness direction as shown by the arrow P3 in FIG. 6. The poling directions in the middle portion 611 of the piezoelectric body 61 are axisymmetric about the vertical line A621 passing through the center C621 of the opening 621. For example, the poling direction shown by the arrow P31 inclined to the right in FIG. 6 and the poling direction shown by the arrow P32 inclined to the left in FIG. 6 are axisymmetrical to each other.

Figure 7:
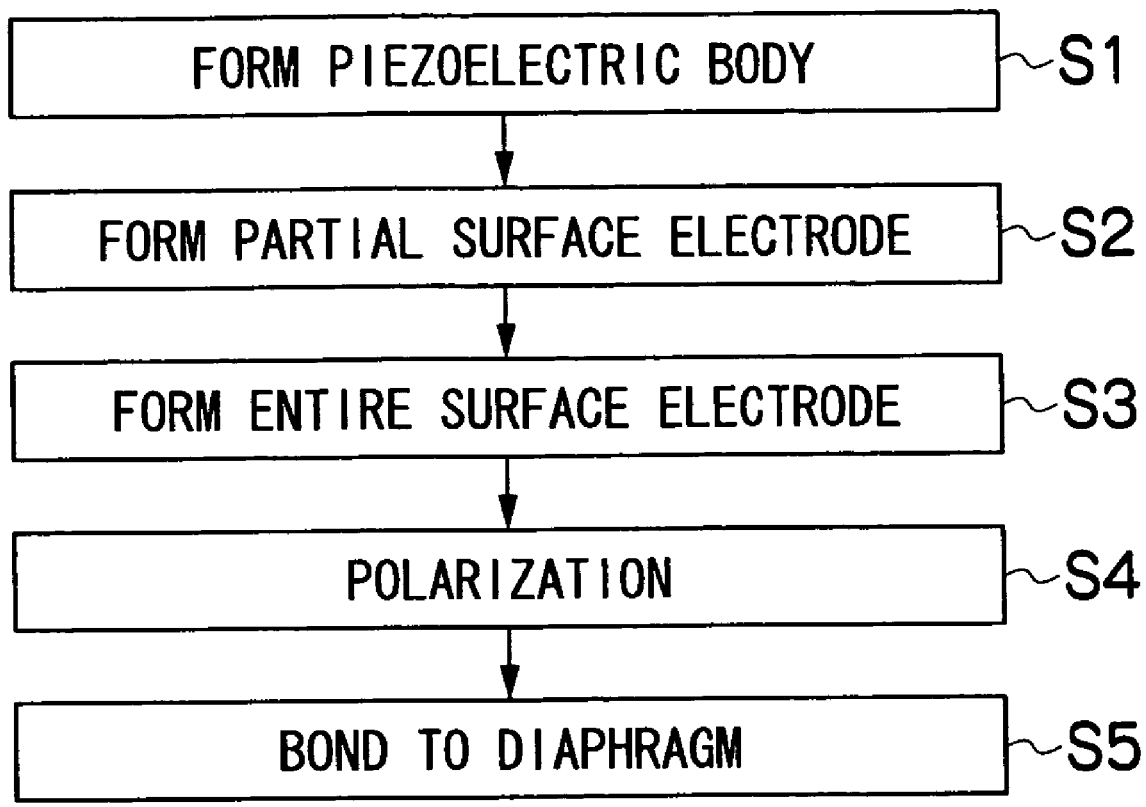
FIG. 7 is a flowchart showing an embodiment of the flow of the process of manufacturing the piezoelectric actuator.

FIG. 7 is a flowchart showing an embodiment of the flow of the process of manufacturing the piezoelectric actuator 60. The piezoelectric body 61 made of a single plate is first formed (S1). For example, the piezoelectric body is formed in bulk by known molding process and baking process. A thin film piezoelectric body or a thick film piezoelectric body may be formed by sol-gel method, sputtering method, aerosol depostion (AD) method, or other such methods.

Next, the partial surface electrode 62 having the opening 621, which is patterned as if the middle portion were removed, is formed on one side of the piezoelectric body 61 (S2). The entire surface electrode 63 is formed on the other side of the piezoelectric body 61 so as to entirely cover the other side of the piezoelectric body 61 (S3).

For example, the piezoelectric body 61 is coated with a metallic paste and heated to fix the electrodes 62 and 63 on the surface of the piezoelectric body 61. The electrodes can also be formed by vapor deposition, sputtering, or other such methods. In this manner, the pair of electrodes 62 and 63 are integrated with the piezoelectric body 61.

The sequence of forming the partial surface electrode 62 and the entire surface electrode 63 is not particularly limited, and it is acceptable to form the partial surface electrode 62 (S2) after the entire surface electrode 63 is first formed (S3).

Next, a specific polarizing voltage is applied between the partial surface electrode 62 and the entire surface electrode 63, so that the piezoelectric body 61 is polarized (S4).

For example, the partial surface electrode 62 is grounded as the negative electrode, and the entire surface electrode 63 is used as the positive electrode, as shown in FIG. 5. Thereby, the (periperal edge) portion 612 polarized primarily in the thickness direction and the (middle portion) portion 611 polarized primarily in the directions oblique to the thickness direction are formed on the piezoelectric body 61, as shown in FIG. 6.

Next, the piezoelectric actuator 60 is bonded to the diaphragm 56 (S5).

Figure 8:
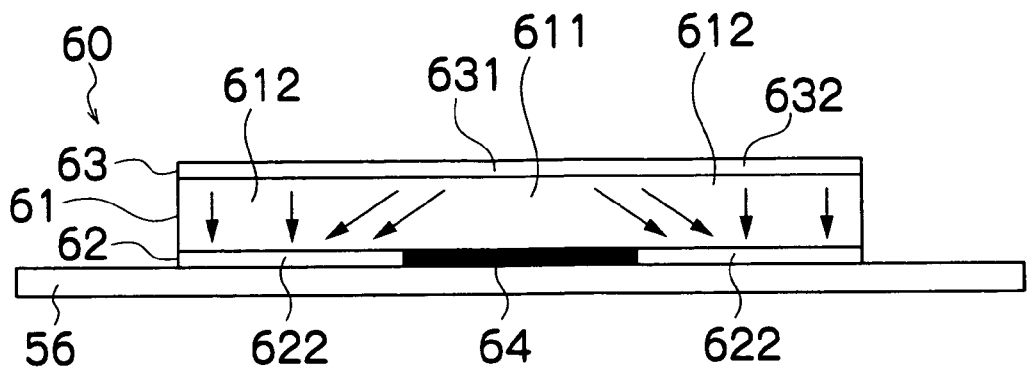
FIG. 8 is an explanatory diagram used to describe the direction of the drive electric field.

FIG. 8 is a schematic view showing a state in which the polarized piezoelectric actuator 60 mounted on the diaphragm 56 is driven.

In FIG. 8, a bonding material is filled as a filler 64 in the opening 621 of the partial surface electrode 62 shown in FIG. 6.

When a specific driving voltage is applied between the pair of electrodes 62 and 63, an electric field is applied to the peripheral edge 612 in the thickness direction inside the piezoelectric body 61, while electric fields are applied to the middle portion 611 in the directions oblique to the thickness direction. More specifically, the electric fields are applied in the middle portion 611 and the peripheral edge 612 inside the piezoelectric body 61 in substantially the same directions as the directions of polarization shown by the arrows in FIG. 6.

Figure 9:
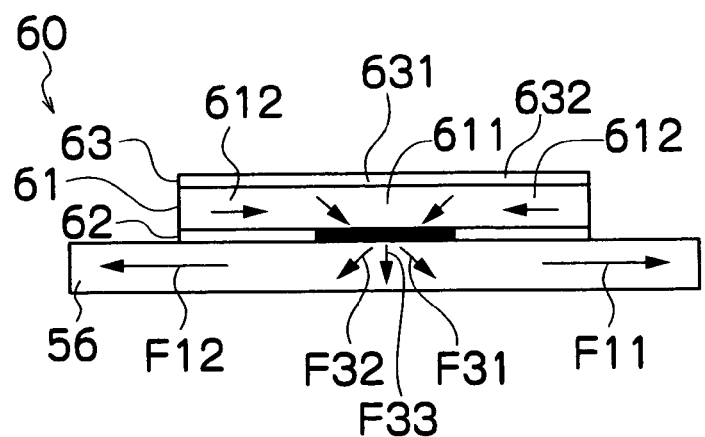
FIG. 9 is an explanatory diagram used to describe the direction of displacement.

Thereby, strain is induced in the peripheral edge 612 primarily in the directions perpendicular to the thickness direction (the directions along the surface) inside the piezoelectric body 61, while strain is induced in the middle portion 611 primarily in the directions oblique to the thickness direction, as shown in FIG. 9.

As a result, stress is applied to the portion of the diaphragm 56 corresponding to the peripheral edge 612 of the piezoelectric body 61 in the directions perpendicular to the thickness direction (the directions along the surface) as indicated by the arrows F11 and F12 in FIG. 9, while stress is applied to the section corresponding to the middle portion 611 of the piezoelectric body 61 in the directions oblique to the thickness direction as indicated by the arrows F31 and F32 in FIG. 9. The arrow F33 in FIG. 9 indicates the resultant force of F31 and F32. In actuality, the force acts on the section corresponding to the middle portion 611 of the piezoelectric body 61 in the direction of the resultant force shown by the arrow F33 (the thickness direction).

Figure 10:
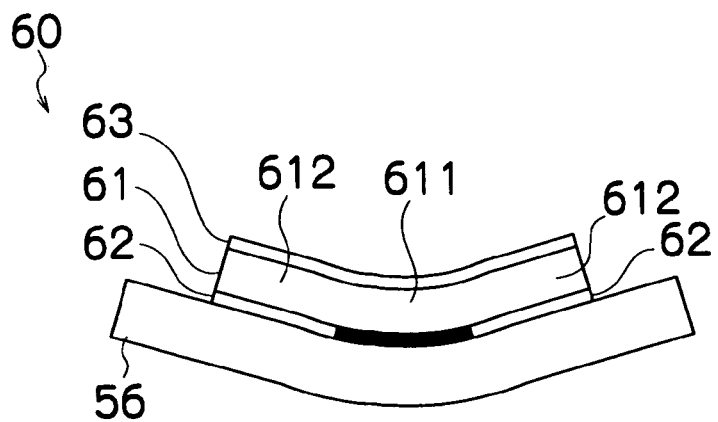
FIG. 10 is a schematic diagram showing the specific manner in which the diaphragm deforms as a result of the stress in the piezoelectric actuator.

The specific state of the displacement of the diaphragm 56 at this time is shown in FIG. 10. The portion of the diaphragm 56 corresponding to the middle portion 611 of the piezoelectric body 61 is displaced in the thickness direction as a result of the stress by a greater amount than the section corresponding to the peripheral edge 612 of the piezoelectric body 61, as shown in FIG. 10.

Figure 13:
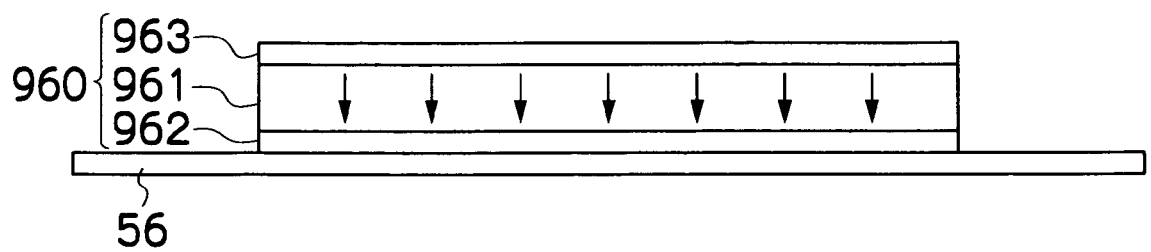
FIG. 13 is a cross-sectional view showing a piezoelectric actuator in the related art.
Figure 14:
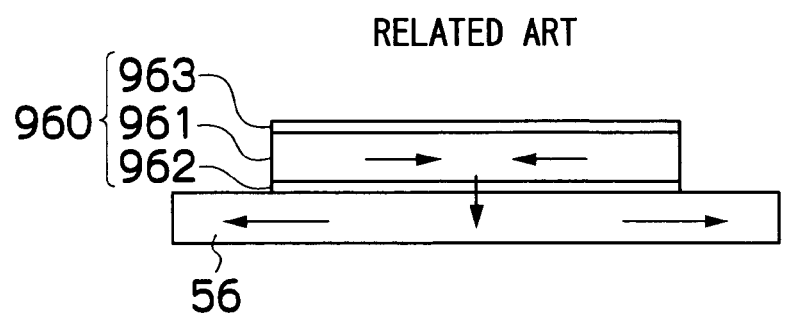
FIG. 14 is an explanatory diagram used to describe the direction of displacement in the piezoelectric actuator in the related art.
Figure 15:
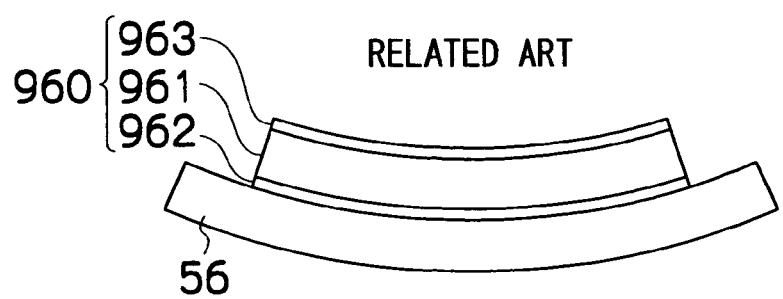
FIG. 15 is a schematic diagram showing the specific manner in which the diaphragm deforms as a result of stress in the piezoelectric actuator in the related art.
Figure 16A:
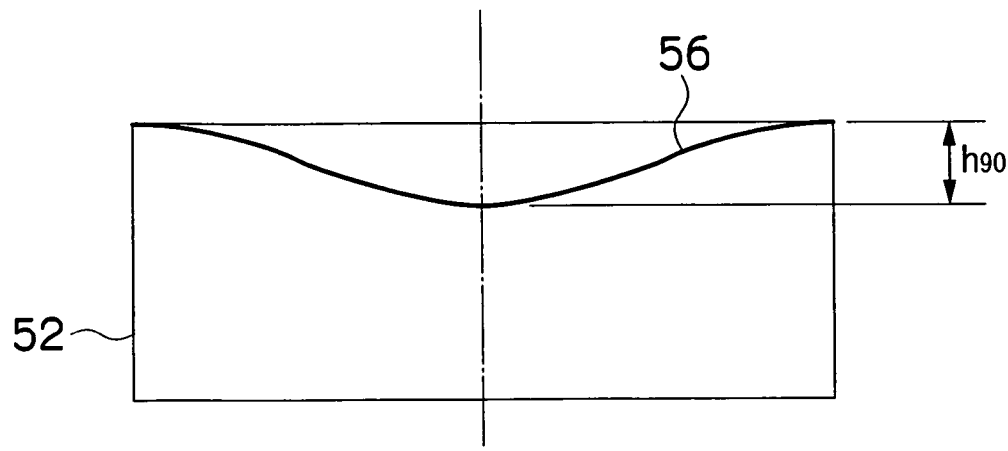
FIGS. 16A and 16B are explanatory diagrams used to describe the relationship between the amount of displacement and the positional relationship of the piezoelectric actuator to the pressure chamber in the related art.
Figure 16B:
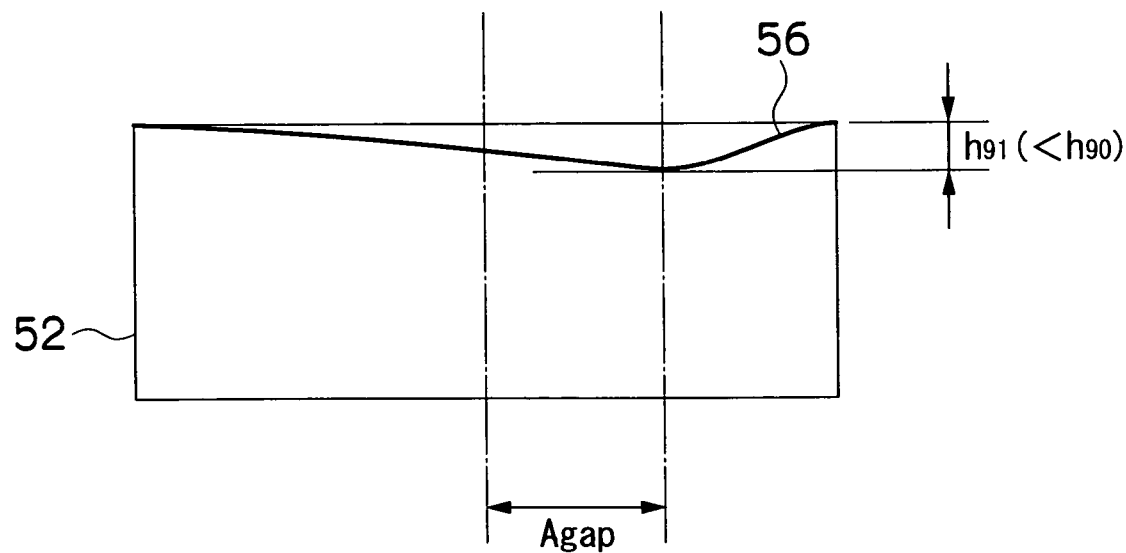

In comparison with the piezoelectric actuator 960 in the related art shown in FIG. 13, the entire electric field energy in the piezoelectric actuator 60 is less by an amount proportionate to the opening 621 formed in the partial surface electrode 62, but the amount of displacement resulting from the total stress is improved in the piezoelectric actuator 60.

Consequently, the piezoelectric actuator 60 of the present embodiment has a greater amount of stress-induced displacement in the thickness direction than the piezoelectric actuator 960 in the related art shown in FIG. 13, without having too complicated of the structure.

Furthermore, the piezoelectric actuator 60 of the present embodiment has the effect of a greater extent of acceptable errors in aligning the positions of the piezoelectric actuator 60 and the pressure chamber 52 than the piezoelectric actuator 960 in the related art shown in FIG. 13. This effect is described below in detail.

Figure 11A:
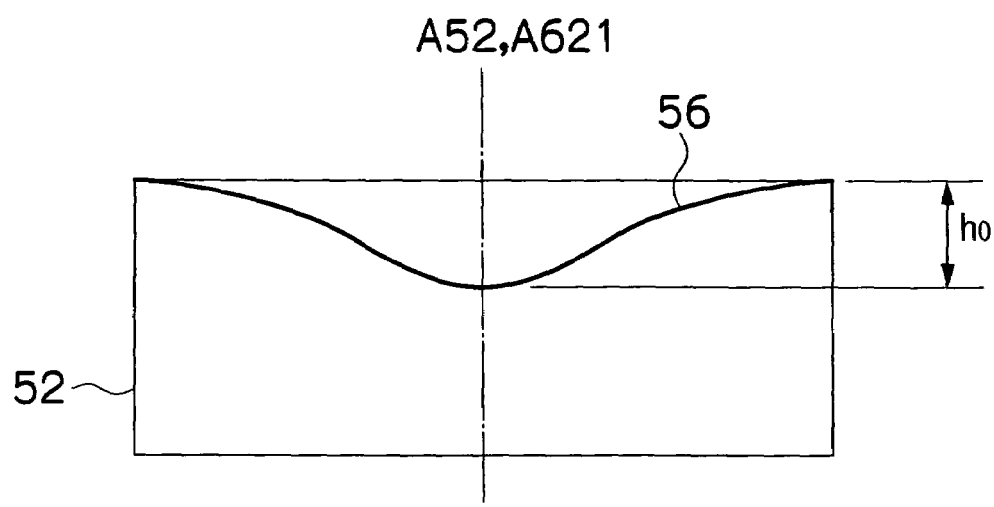
FIGS. 11A and 11B are explanatory diagrams used to describe the relationship between the amount of displacement and the positional relationship of the piezoelectric actuator to the pressure chamber.
Figure 11B:
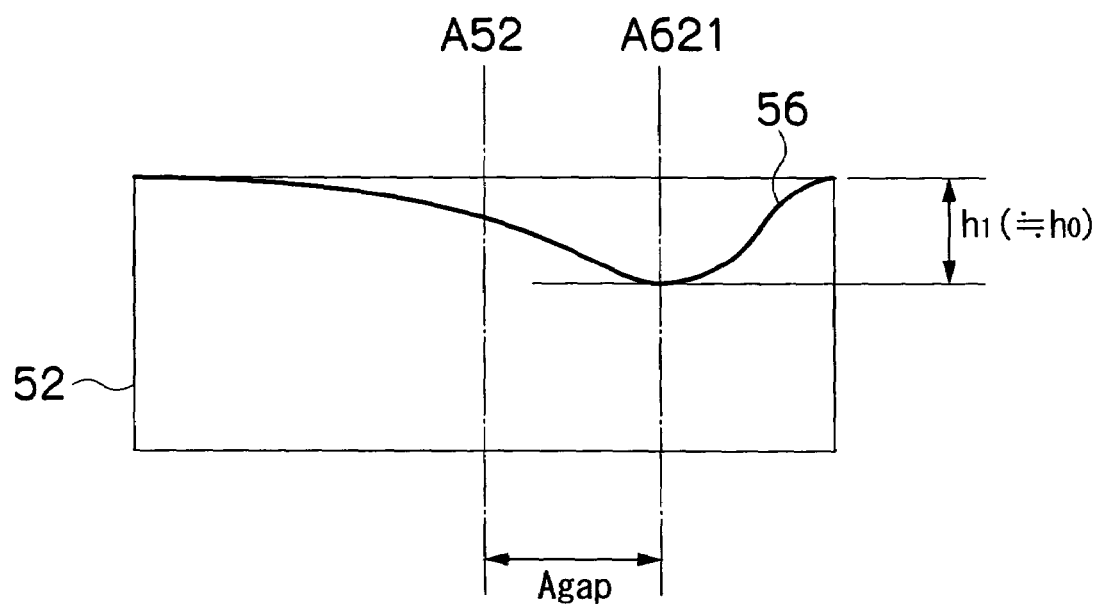

FIGS. 11A and 11B are schematic diagrams showing the relationship between the positional relationship of the piezoelectric actuator 60 of the present embodiment to the pressure chamber 52 and the amount of stress-induced displacement in the thickness direction. In FIGS. 11A and 11B, the piezoelectric actuator 60 is not shown for the sake of simplicity, and the positional relationship is depicted by the vertical line A52 passing through the middle of the pressure chamber 52, and the vertical line A621 passing through the middle of the opening 621 in the piezoelectric actuator 60.

More specifically, FIG. 11A shows the state of displacement with a specific shape in the diaphragm 56 at the most preferred positional alignment, in which the vertical line A52 passing through the middle C52 of the pressure chamber 52 coincides with the vertical line A621 passing through the middle C621 of the opening 621 in the piezoelectric actuator 60, and FIG. 11B shows the state of displacement with a specific shape in the diaphragm 56 at a positional alignment in which the vertical lines A52 and A621 are misaligned.

In comparison between the amount of displacement h0 shown in FIG. 11A in the thickness direction at the positional alignment in which the vertical lines A52 and A621 coincide, and the amount of displacement h1 shown in FIG. 11B in the thickness direction at the positional alignment in which the vertical lines A52 and A621 are misaligned, there is little difference (h0-h1) between the displacement amounts even when the positions of the vertical lines A52 and A621 are misaligned. Consequently, in the piezoelectric actuators 60 of the present embodiment, there are few performance differences between individual piezoelectric actuators 60 resulting from errors in positional alignment, and the effect of improving the yield rate is achieved.

The range of the misalignment amounts Agap for which the difference in the displacement amounts is within a prescribed value (the extent of acceptable errors in positional alignment) varies depending on the shape and dimensions of the opening 621 and other such factors.

The following is a list of the effects exhibited by the piezoelectric actuator 60 of the present embodiment.

(Effect 1) High displacement is obtained regardless of whether the structure is simple.

(Effect 2) The yield rate is improved because of a greater extent of acceptable errors in positional alignment at the mounting process.

(Effect 3) Manufacturing at lower costs is made possible because a layered structure is not a prerequisite, and the piezoelectric body can be formed from a single plate.

(Effect 4) There is no need for a process of removing dedicated polarizing electrodes, and manufacturing at lower costs is made possible because the electrodes can be used for both polarizing and driving.

(Effect 5) Driving is made possible at a lower electric field than in a piezoelectric actuator that is polarized in the direction along the surface, because the principle of polarizing the piezoelectric body essentially in the thickness direction is employed.

(Effect 6) The mounting surface area can be reduced because the configuration has at least a pair of electrodes, and there is no need to align a plurality of electrodes on one piezoelectric body in the direction along the surface. This is suitable for a droplet ejection apparatus in which the nozzle array must be increased in density, for example.

The opening 621 of the partial surface electrode 62 is not particularly limited to the shape shown in FIGS. 3A and 3B, and various shapes can be used.

Figure 12A:
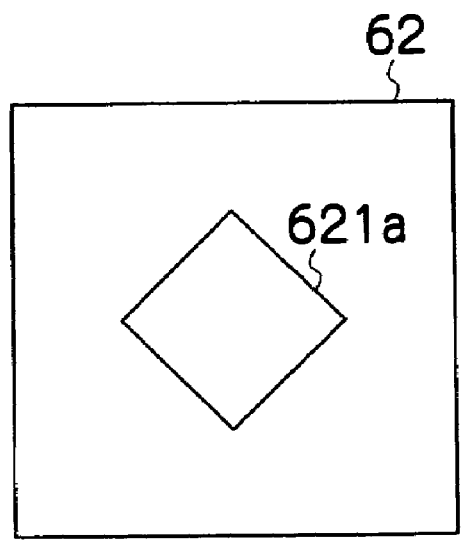
FIGS. 12A, 12B, and 12C are plan views showing other embodiments of openings.
Figure 12B:
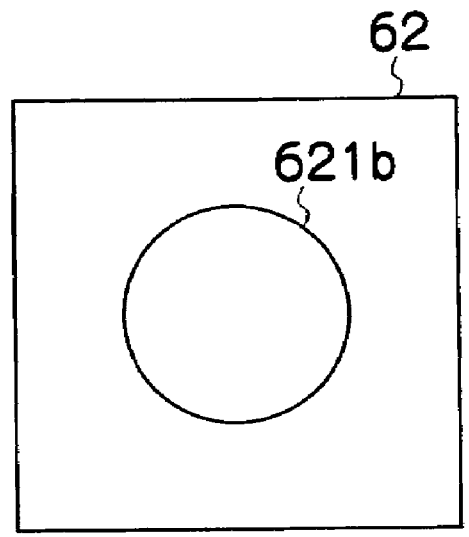
Figure 12C:
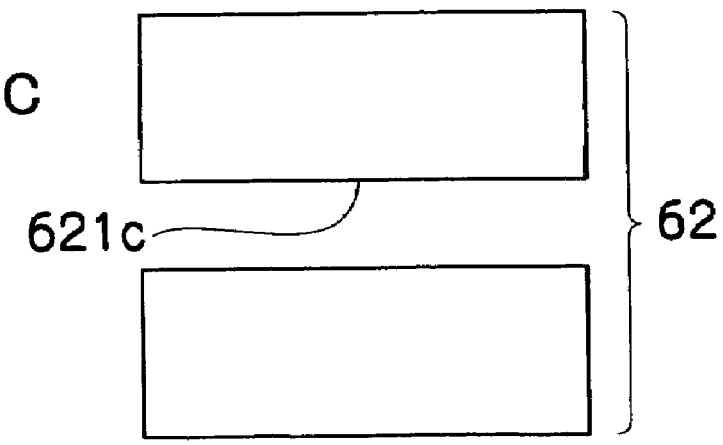

FIGS. 12A, 12B, and 12C show various opening shapes in the partial surface electrode 62.

The opening 621a shown in FIG. 12A is in the shape of a square similar to the opening 621 shown in FIG. 3B, but this shape is rotated by 45 degrees around the center of the opening 621 in relation to the electrode 62 in FIG. 3B.

The opening 621b shown in FIG. 12B is in the shape of a circle.

The opening 621c shown in FIG. 12C is in the shape of a slit. More specifically, the openings 621, 621a, and 621b shown in FIGS. 3B, 12B and 12C have closed shapes surrounded by the periphery (perforated shape), but the shape may be open as shown by the slit shape in FIG. 12C. In addition to a slit shape, the open shape may be a notch, for example.

Although the case in which the partial surface electrode 62 having the opening 621 is attached to the diaphragm 56 has been described as an embodiment, the same effects can be achieved in the droplet ejection apparatus according to an embodiment of the present invention if the piezoelectric actuator 60 is turned upside down and the entire surface electrode 63 is attached to the diaphragm 56. Consideration should be given to the difference in the poling direction of the middle portion 611 of the piezoelectric body 61 and in the direction of the electric field, depending on whether the partial surface electrode 62 or the entire surface electrode 63 is attached to the diaphragm 56.

When the dielectric constant of the piezoelectric material is the same in the middle portion 611 and the peripheral edge 612 of the piezoelectric body 61, it is possible that the polarization is not uniformly created because of the difference in actual electric field strengths in the middle portion 611 and the peripheral edge 612 of the piezoelectric body 61 during the polarization treatment. In such cases, the middle portion 611 facing the opening 621 is given a greater dielectric constant than the peripheral edge 612 in order to generate the polarization in a uniform manner. More specifically, in the piezoelectric body formation step S1 shown in FIG. 7, the middle portion 611 is formed from the material having a dielectric constant greater than the material of the peripheral edge 612, by the aerosol deposition method, for example.

Although the case in which the piezoelectric actuator 60 is used in the droplet ejection apparatus 50 has been described as an embodiment, it is apparent that the piezoelectric actuator 60 according to an embodiment of the present invention is not particularly limited to being used in a droplet ejection apparatus 50 and may be used in other apparatuses. For example, the piezoelectric actuator may be used in acoustic devices which output sound, vibrators which output continuous vibration, piezoelectric sensors, and the like.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A piezoelectric actuator, comprising:
   a plate-shaped piezoelectric body which has a first portion polarized in a thickness direction of the piezoelectric body and a second portion polarized in a direction oblique to the thickness direction; and
   a pair of electrodes for polarizing the piezoelectric body and inducing strain in the piezoelectric body, the electrodes disposed on opposite surfaces of the piezoelectric body facing each other in the thickness direction across the piezoelectric body, wherein
   symmetry portions of one electrode of the pair of electrodes are plane-symmetrical with respect to symmetry portions of the other electrode of the pair of electrodes, and asymmetry portions of the one electrode are plane-asymmetrical with respect to corresponding asymmetry portions of the other electrode in relation to a plane of symmetry that bisects a plane of the piezoelectric body,
   the pair of electrodes polarizes the first portion of the piezoelectric body in the thickness direction and polarizes the second portion of the piezoelectric body in the direction oblique to the thickness direction, and
   the pair of electrodes induces strain in the first and second portions of the piezoelectric body.

2. The piezoelectric actuator as defined in claim 1, wherein the piezoelectric body is made of a single plate.

3. The piezoelectric actuator as defined in claim 1, wherein the piezoelectric body has the first portion polarized in the thickness direction at a peripheral portion of the piezoelectric body in a direction along the surface, and has the second portion polarized in the direction oblique to the thickness direction at a middle portion of the piezoelectric body in the direction along the surface.

4. The piezoelectric actuator as defined in claim 1, wherein an opening is formed in one of the pair of electrodes.

5. The piezoelectric actuator as defined in claim 4, wherein a shape of the opening is one of a polygon, a circle, and a slit.

6. A droplet ejection apparatus, comprising:
   the piezoelectric actuator as defined in claim 1;
   a pressure chamber of which capacity is varied by the piezoelectric actuator; and
   a nozzle which is connected to the pressure chamber and ejects a droplet due to a change in capacity of the pressure chamber.

7. A droplet ejection apparatus, comprising:
   the piezoelectric actuator as defined in claim 4;
   a pressure chamber of which capacity is varied by the piezoelectric actuator; and
   a nozzle which is connected to the pressure chamber and ejects a droplet due to a change in capacity of the pressure chamber, wherein the piezoelectric actuator is arranged so that a vertical line passing through a middle of the pressure chamber passes through the opening in the one of the pair of electrodes.

8. A method of manufacturing a piezoelectric actuator, comprising the steps of:

forming a plate-shaped piezoelectric body;

forming, on opposite surfaces of the piezoelectric body facing each other in a thickness direction of the piezoelectric body across the piezoelectric body, a pair of electrodes, symmetry portions of one electrode of the pair of electrodes being plane-symmetrical with respect to symmetry portions of the other electrode of the pair of electrodes, and asymmetry portions of the one electrode being plane-asymmetrical with respect to corresponding asymmetry portions of the other electrode in relation to a plane of symmetry that bisects a plane of the piezoelectric body;

using the pair of electrodes to induce strain in the piezoelectric body; and using the pair of electrodes to polarize a first portion of the piezoelectric body in the thickness direction and using the pair of electrodes to polarize a second portion of the piezoelectric body in a direction oblique to the thickness direction.

9. A method of manufacturing a droplet ejection apparatus, comprising the step of mounting the piezoelectric actuator manufactured by the method as defined in claim 8, through a diaphragm, onto a plate provided with a pressure chamber communicated with a nozzle.

* * * * *